(12) United States Patent
Keum et al.

(10) Patent No.: US 6,705,020 B2
(45) Date of Patent: Mar. 16, 2004

(54) METHOD OF AND APPARATUS FOR USE IN ORIENTING AN OBJECT AT A REFERENCE ANGLE

(75) Inventors: Gyeong-Su Keum, Suwon-si (KR); Hyung-Sik Hong, Suwon-si (KR); Yun-Sik Yang, Suwon-si (KR); Gum-Chan An, Suwon-si (KR); Hae-Keun Youn, Suwon-si (KR); Byoung-Sik Jung, Suwon-si (KR); Ki-Cheol Choi, Suwon-si (KR)

(73) Assignee: Samsung Electronics Co, Ltd., Suwon (KR)

( * ) Notice: Subject to any disclaimer, the term of this patent is extended or adjusted under 35 U.S.C. 154(b) by 0 days.

(21) Appl. No.: 10/140,074

(22) Filed: May 8, 2002

(65) Prior Publication Data

US 2002/0166979 A1 Nov. 14, 2002

(30) Foreign Application Priority Data

May 10, 2001 (KR) ........................................ 2001-25554

(51) Int. Cl.[7] ................................................ G01B 5/25
(52) U.S. Cl. .......................................... 33/645; 33/502
(58) Field of Search .......................... 33/281, 282, 285, 33/502, 533, 534, 613, 642, 645, 832

(56) References Cited

U.S. PATENT DOCUMENTS

| 3,630,536 | A | * | 12/1971 | Scharfen | ...................... 33/613 |
|---|---|---|---|---|---|
| 4,052,793 | A | * | 10/1977 | Coughlin et al. | .............. 33/645 |
| 4,662,055 | A | * | 5/1987 | VanMeter | ...................... 33/613 |
| 4,693,012 | A | * | 9/1987 | Cesna | .......................... 33/533 |
| 5,406,088 | A | | 4/1995 | Brune et al. | |
| 5,454,170 | A | * | 10/1995 | Cook | .......................... 33/645 |
| 6,298,573 | B1 | * | 10/2001 | Segal et al. | ................... 33/642 |
| 6,446,349 | B1 | * | 9/2002 | Tassakos | ...................... 33/645 |

FOREIGN PATENT DOCUMENTS

| JP | 11-63906 | 3/1999 |
|---|---|---|
| JP | 2000-68226 | 3/2000 |

* cited by examiner

*Primary Examiner*—G. Bradley Bennett
(74) *Attorney, Agent, or Firm*—Volentine Francos, PLLC

(57) ABSTRACT

An apparatus for use in orienting an object at a reference angle includes a pin gauge having at least two projections located at an end of the body of the apparatus. The projections are located at certain X Y coordinates of an X, Y Z Cartesian coordinate system. A horizontal support supports the body so as to be movable horizontally in the longitudinal direction of the projections. A mechanical drive member is operable to move the body mechanically in the horizontal direction. The apparatus may also include a vertical support and vertical drive member. The pin gauge is mechanically moved into contact with a surface of an object to provide a reference angle for the object. Then the object is pivoted, if necessary, to bring the surface into point contact with all of the projections of the pin gauge, whereupon the object is oriented at the reference angle. Process errors in aligning the object using the reference angle are reduced because the orienting of the object at the reference angle is accomplished using mechanical elements.

20 Claims, 8 Drawing Sheets

77

METHOD OF AND APPARATUS FOR USE IN ORIENTING AN OBJECT AT A REFERENCE ANGLE

BACKGROUND OF THE INVENTION

1. Field of the Invention

The present invention relates to a method of and apparatus for use in orienting an object at a predetermined reference angle with respect to a given plane(s). More particularly, the present invention relates to a process of aligning a chuck relative to equipment by which a substrate supported by the chuck will be processed.

2. Description of the Related Art

Currently, semiconductor memory devices are being developed at a rapid pace due to the widespread use of computers for processing various types of information. To this end, the current art is focused on developing and realizing memory devices having a high degree of integration, response speed, and reliability. Accordingly, highly precise process techniques are required for fabricating today's semiconductor memory devices.

Semiconductor devices are fabricated by such processes as an ion implantation process, a thin film forming process and a patterning process. Needless to say, all of the conditions under which these fabrication processes are performed must be controlled. If the process conditions are not completely controlled, process errors may be generated. Moreover, a semiconductor substrate is supported by a chuck during semiconductor device fabrication processing, such as during the thin film forming process, pattern forming process, and ion implantation process. Therefore, one of the process conditions usually requiring control is the positioning or aligning of the chuck on which the semiconductor substrate is placed.

The position of the chuck is controlled as follows, using the ion implantation process as an example.

Referring to FIG. 1, a substrate 10 should be tilted relative to an ion beam during the implantation process to prevent a channeling effect from occurring. The channeling effect refers to a situation in which ions injected into the substrate pass through voids in the substrate, i.e., spaces where atoms are not present. Japanese Patent Laid-Open Publication No. 2000-68226 and U.S. Pat. No. 5,406,088 (issued to Brune, et al.) each disclose a method of preventing the channeling effect from occurring during the ion implantation process. More specifically, Japanese Patent Laid-Open Publication No. 2000-68226 discloses a method in which the scanning angle of an ion beam is controlled to prevent the channeling effect. On the other hand, U.S. Pat. No. 5,406,088 discloses a method in which the chuck is manipulated to prevent the channeling effect.

In the latter case, the chuck on which the substrate 10 is placed is preferably tilted at the angle of 7 degrees with reference to the vertical before the ion implantation process begins. The process of tilting the chuck to position the substrate 10 relative to the ion beam will hereinafter be referred to as the process of aligning the chuck.

The process of aligning the chuck includes the steps of first orienting the chuck vertically and then tilting the chuck 7 degrees with respect to the vertical. The step of orienting the chuck vertically is performed by a reference angle providing apparatus shown in FIG. 2.

Referring to FIG. 2, the reference angle providing apparatus 20 is disposed on the bottom surface 17 of the process chamber. The reference angle providing apparatus 20 includes a surface contact portion 200 that makes surface contact with the chuck 15, and a supporting portion 210 for supporting the surface contact portion 200. The supporting portion 210 includes a supporting bar 210a for supporting the surface contact portion 200 and a bottom portion 210b for supporting the supporting bar 210a. The bottom portion 210b is mounted to the bottom surface 17 of the process chamber. The chuck 15 is also mounted to the bottom surface 17 of the chamber.

The surface contact portion 200 of the reference angle providing apparatus 20 is brought into contact with the chuck 15 before the ion implantation process begins. An alignment error is judged to occur at that time if the entire surface of the contact portion 200 does not contact the chuck 15. In that case, X and Y coordinates of the chuck are adjusted such that the chuck 15 contacts the entire surface of the contact portion 200. Preferably, the chuck 15 is oriented at an angle of 0 degrees relative to the X-Y plane (the vertical) and at an angle of 90 degrees relative to the Y-Z plane (the horizontal). Once the chuck 15 and the surface contact portion 200 are in complete surface contact with each other, the chuck 15 is tilted at an angle of 7 relative to the X axis.

However, the reference angle supplying apparatus 20 is subject to the following problems. First, the apparatus 20 itself is moved manually to place the surface contact portion 200 in contact with the chuck 15. Therefore, the apparatus is shaken during this operation, which shaking can cause an alignment error to occur. Also, alignment errors are produced because the bottom portion 210b of the reference angle supplying apparatus 20 is often does not lie precisely flat on the bottom surface 17 of the chamber. Still further, the state of contact between the chuck 15 and the surface contact portion 200 is judged by an operator, whereby the alignment process is prone to human error. Furthermore, the precision or calibration of the reference angle supplying apparatus 20 degrades over time. However, the apparatus 20 has no means by which its own misalignment can be detected. Therefore, the apparatus 20 may be operated continuously while being out of self-alignment. As a result, the chuck 15 is oriented improperly by the apparatus 20.

For the reasons described above, process errors frequently occur when the chuck is aligned using the conventional reference angle providing apparatus. Accordingly, these errors translate so much into the process of fabricating the semiconductor device that the productivity of the fabricating process suffers.

SUMMARY OF THE INVENTION

An object of the present invention is to obviate the above-described problems of the prior art. Accordingly, an object of the present invention is to provide a method and apparatus by which an object to be aligned may first be oriented precisely at a desired reference angle.

To achieve this object, the present invention provides an apparatus for providing an object with a reference angle, which apparatus comprises a main body and a pin gauge for making point contact with the surface of the object.

The pin gauge has at least two projections which project in the direction of a Z axis away from an end surface of the body. Two or more of the projections are located on X and Y axes, respectively, orthogonal to one another and to the Z axis and spaced from the origin of the coordinate system defined by the X, Y and Z axes.

In addition, a mechanical drive member(s) is/are used to bring the pin gauge into initial contact with the object to be aligned. In particular, a horizontal support having a horizontal guide engaged with the main body, and a horizontal drive member are used to move the body horizontally in the direction of the Z axis (longitudinal direction of the projections of the pin gauge) to bring the pin gauge into initial point contact with the object. A vertical support having a vertical guide, and a vertical drive may also be provided to bring the pin gauge up or down to the level of the object to be aligned.

The vertical support may include a bottom member on which the horizontal support is disposed, and a vertical member on which the vertical guide is disposed. The vertical guide is engaged with at least the horizontal support.

Each mechanical drive member preferably comprises a fixed nut and a drive screw connected to the main body and threaded with the fixed nut. Thus, the drive screw and the body of the apparatus connected thereto will be moved linearly when the drive screw is rotated relative to the fixed nut. An actuating member, such as a knob, allows the drive screw to be rotated.

Preferably, the projections comprise proximity sensors for sensing the distances between the ends of the projections and the object. Also, a display is used for displaying the measurements made by the proximity sensors. Therefore, the position of the object relative to the pin gauge providing the reference angle is not judged by the operator but by the sensors. And, the results are displayed to the operator. That is, the relative position of the object is determined objectively. As a result, errors in the process of aligning the object can be minimized.

Furthermore, a reference angle calibration unit can be used to check the accuracy of the reference angle providing apparatus. The calibration unit has a reference surface against which the pin gauge can be pressed to check the state of point contact. In this way, if the pin gauge is determined to have become inaccurate due to its continuous use over a long period of time, the pin gauge can be repaired. Accordingly, the reliability of the apparatus is ensured.

For instance, the reliability in of the apparatus in facilitating the aligning of a chuck of semiconductor fabricating equipment is ensured. In this case, the reference angle providing apparatus is placed on the bottom surface of a process chamber in which the chuck is disposed. The pin gauge is moved mechanically towards the chuck until the pin gauge contacts the surface of the chuck. Accordingly, the gauge is not shaken as it contacts the chuck, whereby the maintains a high degree of accuracy.

Once the pin gauge contacts the surface of the chuck, the state of point contact between the end of each of the projections of the pin gauge and the surface of said chuck is checked, i.e., the distances between the projections of the pin gauge and the surface of the chuck is sensed by the proximity sensors. The chuck is then pivoted, if necessary, to place the surface of the chuck in point contact with the ends of all of the projections of the pin gauge. Hence, the chuck is oriented at the reference angle. Finally, the chuck is tilted a predetermined amount from the reference angle. In the case of an ion implanter, the chuck is tilted 7 degrees to prevent the channeling effect from occurring during the implantation process.

BRIEF DESCRIPTION OF THE DRAWINGS

The above and other objects, features and advantages of the present invention will become more apparent by referring to the following detailed description of the preferred embodiments thereof made in conjunction with the accompanying drawings, of which.

DETAILED DESCRIPTION OF THE PREFERRED EMBODIMENTS

The preferred embodiments of apparatus for use in providing a reference an object to be aligned with a reference angle according to the present invention will be described in detail hereinafter with reference to the accompanying drawings. Note, the reference angle refers to an angle relative to the vertical. The apparatus according to the present invention can be adapted for use in orienting an object (the plane of the object) at various reference angles.

Figure 1:
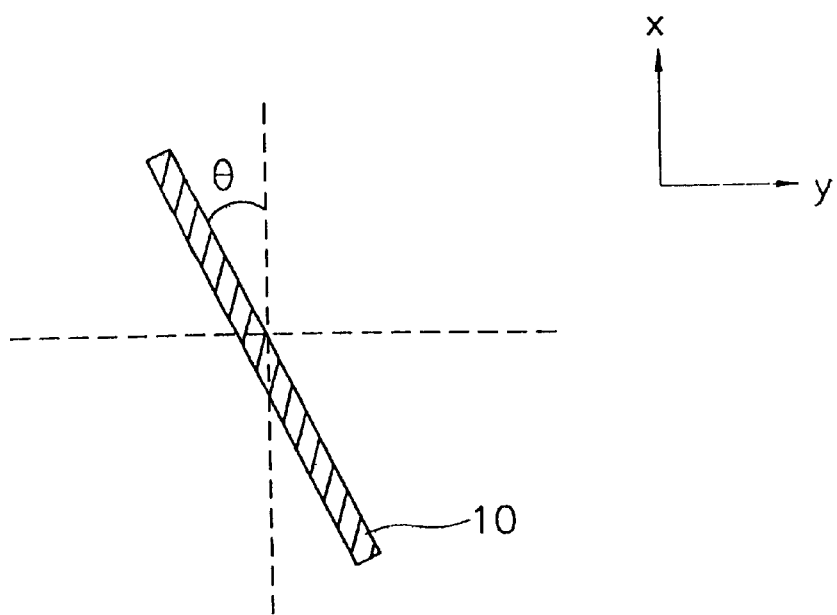
FIG. 1 is a schematic diagram of a substrate tilted to prevent a channeling effect from occurring during an ion implantation process.
Figure 2:
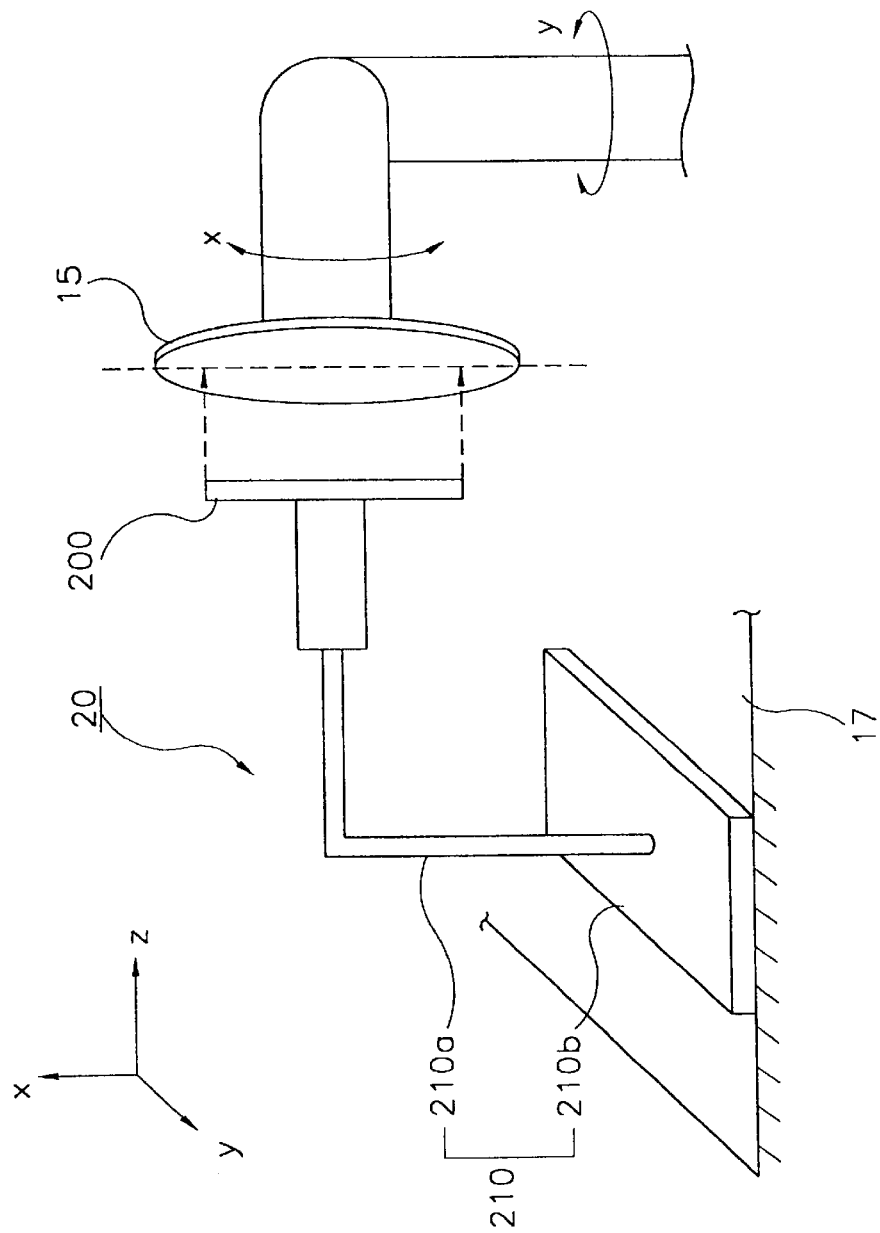
FIG. 2 is a schematic diagram of a conventional reference angle providing apparatus for use aligning the chuck on which the substrate is supported during the ion implantation process.
Figure 3:
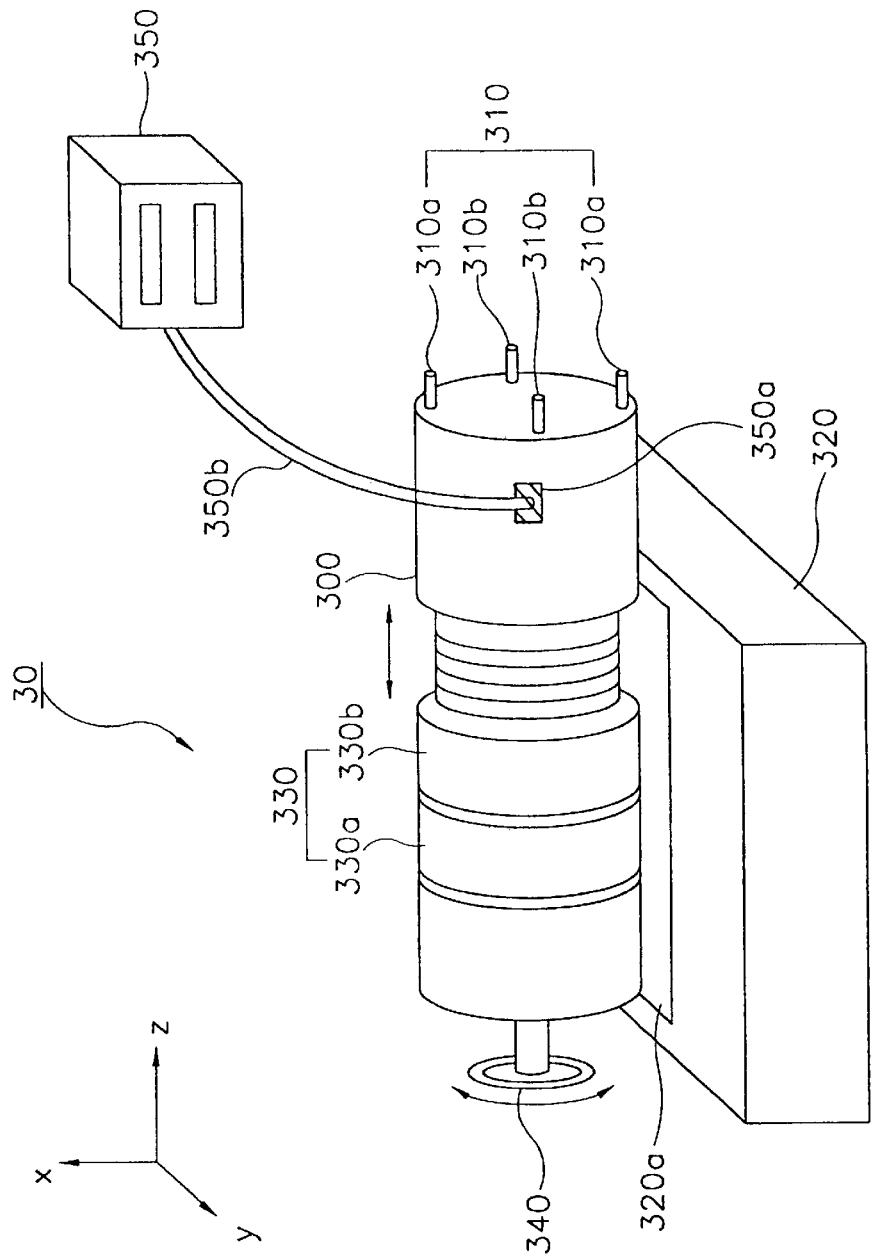
FIG. 3 is a schematic diagram of a first embodiment of an apparatus for providing an object with a reference angle according to the present invention.

Referring now to FIG. 3, a first embodiment of an apparatus 30 for providing an object to be aligned with a reference angle includes a generally cylindrical body 300, and a pin gauge 310 disposed at one end of the cylindrical body 300. The pin gauge 310 comprises at least two pins or projections 310a, 310b extending from the end surface of the body 300. Each of the pins projects in the direction of a Z axis, and is located on a respective one of X and Y axes orthogonal to one another and to the Z axis as spaced from the origin of a coordinate system comprising the X, Y and Z axes.

Figure 4:
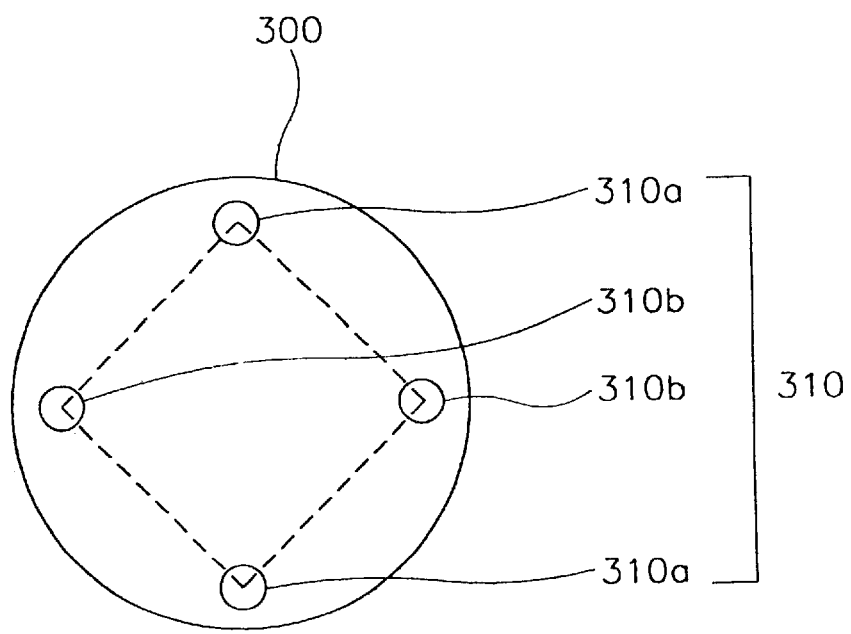
FIG. 4 is a front view of the apparatus showing a pin gauge thereof.

FIG. 4 shows the relative position of the pins 310a, 310b of the pin gauge 310 in detail. Referring to FIG 4, the pins are laid out along the corners of a diamond on the end surface of the body 300, respectively. Two of the pins 310a are disposed opposite each other along the X axis, and two other pins 310b are disposed opposite each other along the Y axis. That is, the first pins 310a disposed along the X axis project from an upper portion and from a lower portion of the end surface of the body 300, respectively. On the other hand, the second pins 310b disposed along the Y axis project from a right hand side and a left hand side of the end surface of the body 300, respectively. Also, as shown in FIG. 4, the first and second pins 310a, 310b are therefore located alongside the outer peripheral edge of the end surface of the body 300.

Figure 5:
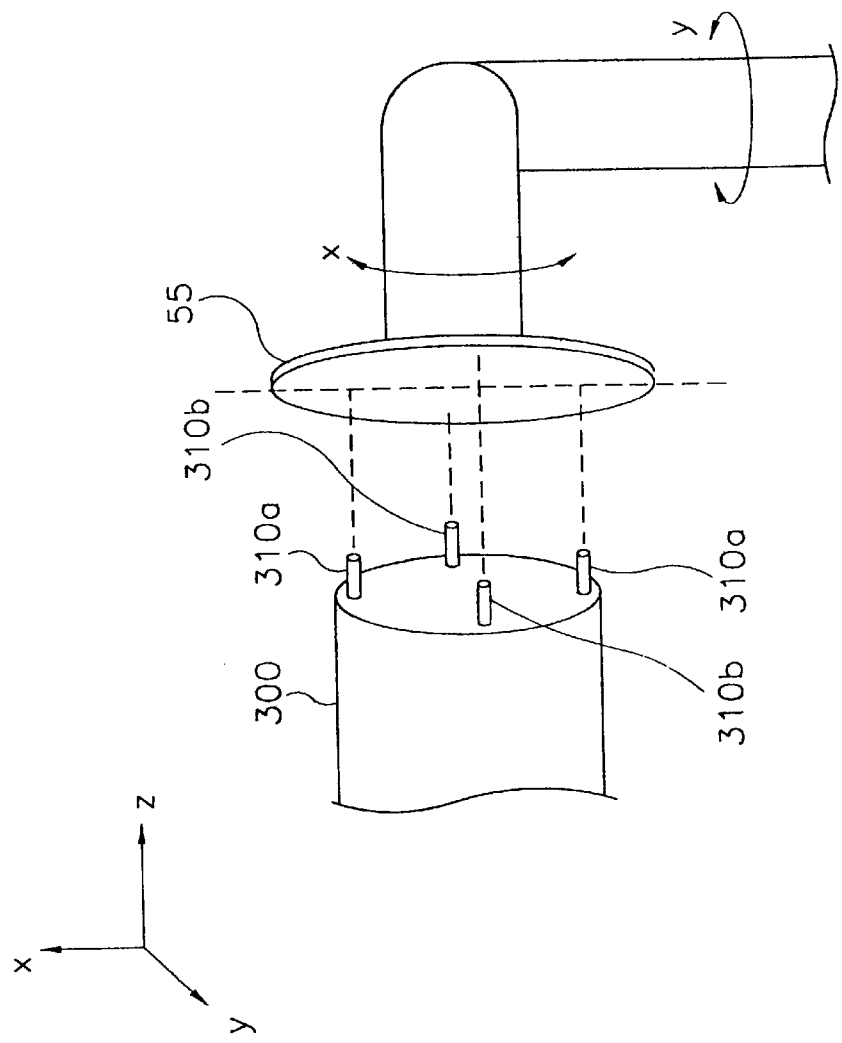
FIG. 5 is a schematic diagram of the front of the apparatus, showing the manner in which a chuck is provided with the reference angle using the pin gauge of the apparatus.

FIG. 5 illustrates the manner in which a chuck 55 is oriented at the reference angle using the pin gauge 310 of the apparatus 30. First, the pin gauge 310 is brought into point contact with the chuck 55. Then, if necessary, the chuck 55 is rotated about the X and Y axes by respective rotary members until the chuck 55 completely contacts all of the pins 310a, 310b of the pin gauge 310. In the case of ion implantation equipment, after the chuck 55 is oriented at the reference angle using the pin gauge 310, the (plane of the) chuck 55 is tilted at an angle of 7 degrees with respect to the reference angle.

Figure 6:
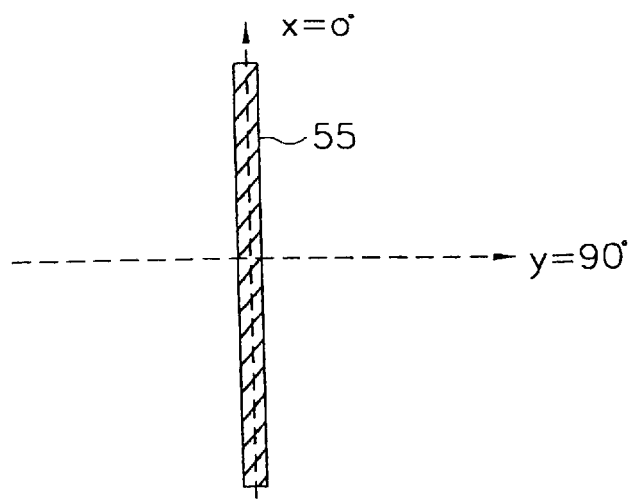
FIG. 6 is a schematic diagram of the chuck oriented at the reference angle by use of the apparatus of FIG. 3.

FIG. 6 shows the chuck 55 oriented at the reference angle. Referring to FIG. 6, the reference angle is 0 degrees with respect to the X axis direction (the vertical) and 90 degrees with respect to the Y axis direction (in this case, representing the horizontal).

Referring back to FIG. 3, the apparatus 30 also includes a body support 320. The body support 320 has the overall form of a plate, and is disposed on a bottom surface (77, FIG. 7) of a chamber to support the body 300. The chuck 55 is mounted on the same surface 77 of the chamber. The body support 320 includes a horizontal guide 320a that is in a sliding engagement with the body 300 such that the body 300 may be moved horizontally along the body support. That is, movement of the body 300 is directed by the horizontal guide 320a to bring the pin gauge 310 into point contact with the surface of the chuck 55.

Figure 7:
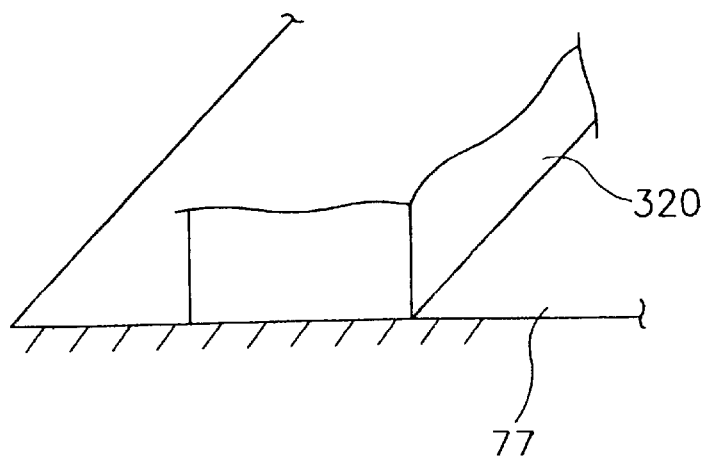
FIG. 7 is a perspective view of part of the apparatus of FIG. 3 that is disposed on the bottom surface of a process chamber.

Referring specifically now to FIG. 7, the mounting surface of the body support 320 is planar to within a tolerance of less than 1 $\mu$m. Therefore, the body support 320 has a very high degree of uniformity such that the pins of the pin gauge 310 will extend substantially parallel to the bottom surface 77 of the chamber when the apparatus 30 is disposed thereon. The bottom surface of the body support 320 is machined by means of a planer, a planomiller and the like, which are high precision devices, to impart the high degree of flatness to the bottom surface thereof. The thickness of the body support 320 is such that the pin gauge 310 will be located at the same level as the chuck 55 when the body support 320 is disposed on the bottom surface 77 of the chamber. Accordingly, a precise reference angle can be provided.

The apparatus 30 also includes a drive member 330 for moving the body 300 towards the chuck 55, and an actuating member 340 for actuating the drive member 330. The drive member 330 is integral with the body 300. More specifically, the drive member 330 comprises a fixed nut 330a, and a horizontal drive screw 330b threaded to the fixed nut 330a and connected to the body 300. The body 300 is driven along the horizontal guide 320a by the horizontal drive screw 330b as the screw 330b is rotated relative to the fixed nut 330a. The horizontal drive screw 330b can be rotated by means of the actuating member 340 (a knob, as shown in the figure). When the horizontal drive screw 330b of is moved linearly by turning the actuating member 340, the pin gauge 310 of the apparatus 30 is brought into point contact with the chuck 55. Thus, the chuck 55 can be oriented at the reference angle.

Figure 8:
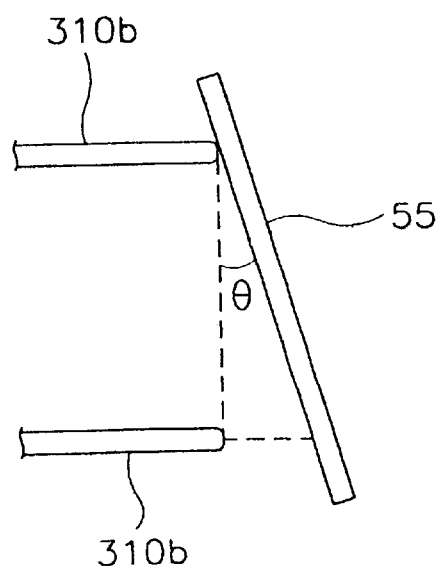
FIG. 8 is a schematic diagram of a pin gauge in the form of proximity sensors in the apparatus of FIG. 3.

In one form of the apparatus 30, the pins or projections of the pin gauge 310 comprise distance measuring sensors, known in the art per se and often referred to as proximity sensors. FIG. 8 shows the manner in which such an apparatus 30 is used to orient the chuck 55 at the reference angle. For example, if only one of the pins 310b disposed along the Y axis makes point contact with the chuck 55 once the pin gauge 310 has been moved into contact with the chuck 55, the sensor constituting the other pin 310b disposed along the Y axis measures the distance between the end thereof and the surface of the chuck 55.

The angle $\theta$ by which the chuck 55 deviates from the reference position can be easily determined because tan $\theta$ is equal to the sensed distance (between the end of the pin 310b and the chuck 55) divided by the known distance between the pins 310b disposed along the Y axis. Accordingly, the chuck 55 is pivoted an angular amount $\theta$ about the point where the one pin 310b makes contact with the chuck 55, whereby the chuck is brought into contact with the other pin 310b. Thus, the chuck is oriented at the reference angle.

Furthermore, the apparatus 30 includes a display 350 by which an operator can monitor the process of aligning the chuck 55. In particular, the distances between the ends of the pins 310a, 310b and the chuck 55 are displayed. The display 350 is connected by a cable 350b to a terminal 350a attached to a side of the body 300. However, the display 350 may be directly integrated with the side of the body 300. In any case, the operator can identify the present state of the chuck 55 through the display 350 and then control the rotary members to which the chuck 55 is connected to orient the chuck 55 at the reference angle.

Figure 9:
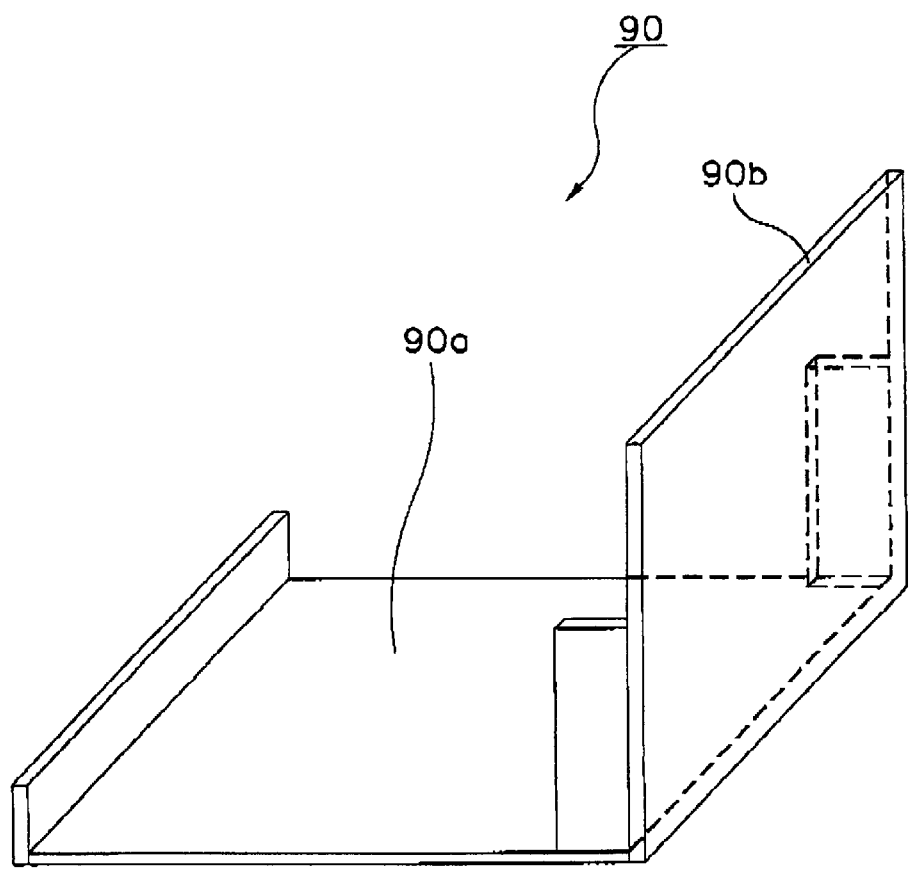
FIG. 9 is a schematic diagram of a unit for checking the calibration of the pin gauge of the apparatus of FIG. 3.

Now, when the apparatus 30 is continuously used for a long period of time, the pin gauge 310 may lose its calibration. Obviously if the pin gauge 310 is not repaired, the apparatus 30 will lose its ability to properly orient the chuck 55 at the correct reference angle. FIG. 9 shows a unit 90 for checking and correcting the calibration of the pin gauge 310.

Referring to FIG. 9, the reference angle calibration unit 90 has a surface 90b against which the pin gauge 310 is pressed to check the point contact therewith. This surface 90b of the reference angle calibration unit 90 is substantially normal to the horizontal surface 90a. If point contact is not established between all of the pins 310a, 310b of the pin gauge 310 of the apparatus 30, the pin gauge 310 is repaired with reference to its state of contact with the surface 90b. Also, when the apparatus 30 is not used, the apparatus 30 is received in and stored by the reference angle calibration unit 90 as resting on surface 90a. That is, the reference angle calibration unit 90 has a structure by which the apparatus can be calibrated as well as being stored. However, the apparatus 30 can be stored in a separate unit (not shown) such as a cabinet.

Figure 10:
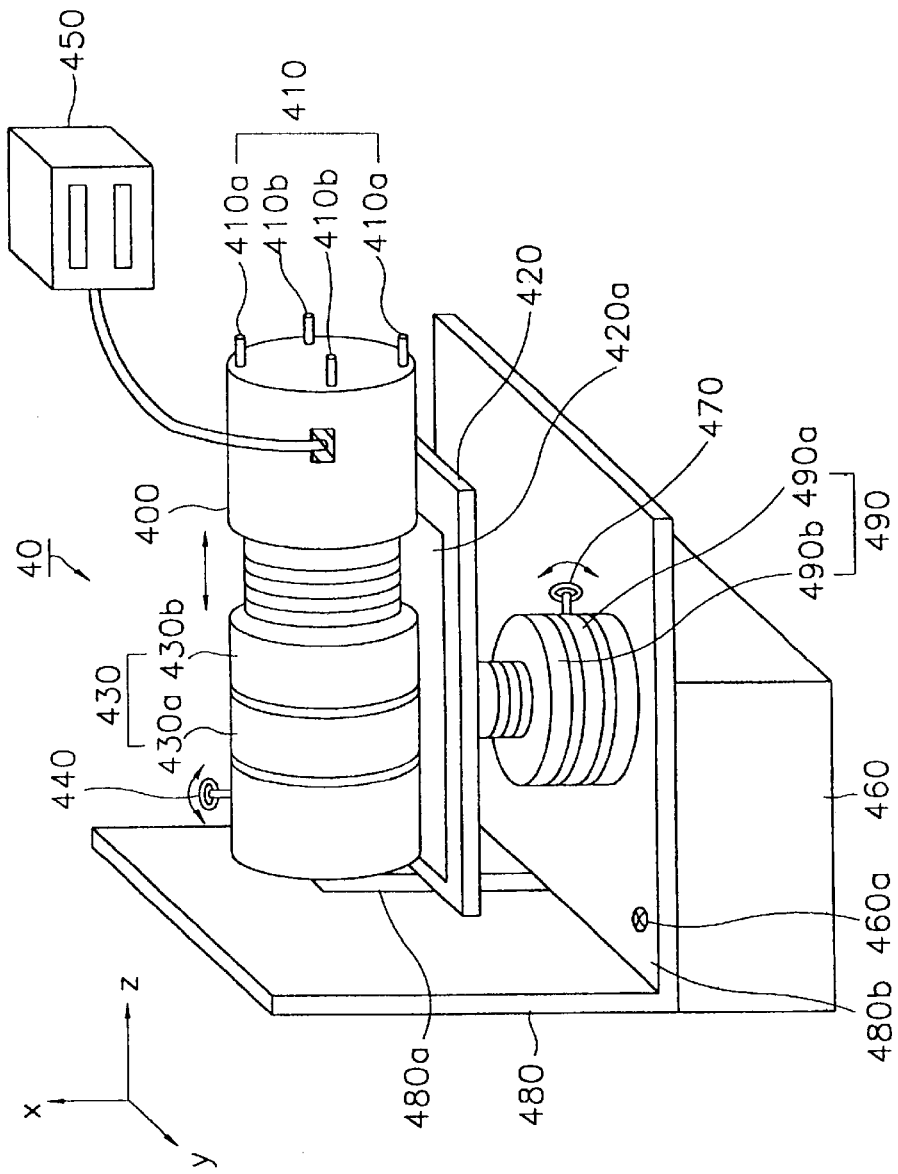
FIG. 10 is a schematic diagram of a second embodiment of an apparatus for providing an object with a reference angle according to the present invention.

FIG. 10 shows a second embodiment of an apparatus 40 for providing a reference angle for an object according to the present invention.

Referring to FIG. 10, the apparatus 40 includes a body 400, a pin gauge 410, and a display 450. The body 400, pin gauge 410 and display 450 have the same structure and function as those of the first embodiment of the present invention.

Also, similar to the first embodiment, the apparatus 40 includes a horizontal support 420 for supporting the body 400. The horizontal support 420 has the overall shape of a plate, and includes a horizontal guide 420a that cooperates with the body 400 to guide the body 400 horizontally. That is, the body 400 is guided for movement along the horizontal guide 420a to bring the pin gauge 410 into point contact with the chuck.

The apparatus 40 also includes an L-shaped vertical support 480 that supports the horizontal support 420. The vertical support 480 has a bottom surface 480b that makes contact with the bottom surface of the chamber. A base 460 is disposed between the body 400 and the bottom surface 480b of the vertical support 480. The base 460 is connected to the vertical support 480 by means of screws. A surface of the base 460 is machined to have uniformity with respect to the opposite surface of the base support, i.e., a less than 1 µm variation in its planarity. The base 460 is thus formed in the same manner described in connection with the body support 320 of the first embodiment so that the pins 410a, 410b of the pin gauge 410 will extend substantially parallel to the horizontal bottom surface.

The vertical support 480 has a vertical guide 480a that guides the vertical movement of the body 400. Both the body 400 and the horizontal support 420 are engaged with the vertical guide 480a. The body 400 is moved vertically, as guided by the vertical guide 480a, so that the pin gauge 410 can be brought face-to-face with the chuck.

The apparatus 40 also includes a first drive member 430 for moving the body 400 horizontally along the horizontal guide 420a and a first actuating member 440 for actuating the first drive member 430. The first drive member 430 is integral with the body 400. More specifically, the first drive member 430 comprises a fixed nut 430a, and a horizontal drive screw 430b threaded to the fixed nut 430a and connected to the body 400. The body 400 is driven along the horizontal guide 420a by the horizontal drive screw 430b as the screw 430b is rotated relative to the fixed nut 430a. The horizontal drive screw 430b can be rotated by means of the actuating member 440 (a knob, as shown in the figure). When the horizontal drive screw 430b of is moved linearly by turning the actuating member 440, the pin gauge 410 of the apparatus 40 is brought into point contact with the chuck. Thus, the chuck can be oriented at the reference angle.

The apparatus 40 further comprises a second drive member 490 for moving the body 400 vertically along the vertical guide 480b, and a second actuating member 470 for handling the second moving member 470. The second drive member 490 is mounted between the horizontal support 420 and the bottom 480b of the vertical support 480. The second drive member 490 includes a fixed nut 490a and a vertical drive screw 490b threaded to the fixed nut 490a. Accordingly, the body 400 is moved along the vertical guide 480a as the vertical drive screw 490b is rotated by the second actuating member 470.

Note, the reference angle calibration unit 90 of FIG. 9 can be used to also check the accuracy of and calibrate the pin gauge 410 of this embodiment, in the same manner described in connection with the first embodiment. That is, if point contact is not established between all of the pins 410a, 410b of the pin gauge 410 of the apparatus 40, the pin gauge 410 is repaired with reference to its state of contact with the surface 90b.

The process of orienting the chuck of the ion implanter at the reference angle using the apparatus according to the present invention will be described below.

First, the apparatus is placed in the process chamber of the ion implanter. At that time, the apparatus is situated on the bottom surface of the chamber adjacent to the chuck. The actuating member(s) is/are operated to rotate the drive screw(s). As a result, the main body of the apparatus is moved towards the chuck. In the case of the first embodiment, the height of the apparatus is such that the pin gauge 310 faces the chuck when the apparatus 30 is disposed on the bottom surface of the process chamber. Thus, the actuating member 340 is manipulated (turned) to move the horizontal drive screw 330b and the body 300 integral therewith toward the chuck until the pin gauge 310 contacts the chuck. On the other hand, in the case of the second embodiment, the actuating members 440, 470 are manipulated to move the body 400 along the horizontal guide 420a and the vertical guide 480a. The manipulation of the actuating members 440, 470 is carried out such that the pin gauge 410 is brought up or down to the same level as the chuck, and then the pin gauge 410 is brought into contact with the chuck. At this time, the state of point contact between the end of each of the projections of the pin gauge and the chuck is sensed. This information is used to determine whether the orientation of the chuck is within a certain range. The measurements and the result of this determination are indicated on the display. Subsequently, the rotary members on which the chuck is mounted are rotated by amounts necessary to orient the chuck at the reference angle. Once this orienting of the chuck is completed, the chuck is tilted by an angle of 7 degrees relative to the reference position, i.e., the plane of the chuck is inclined at an angle of 7 degrees relative to the vertical. The aligning of the chuck in this way relative to the ion beam of the implanter prevents the channeling effect from occurring during the implantation process.

Also, if the apparatus has been used for a long time, for example, the reference angle calibration unit 90 of FIG. 9 is used to check the accuracy of the pin gauge and, if necessary, calibrate the pin gauge.

As described above, the apparatus according to the present invention can provide a precise reference angle for an object because the gauge of the apparatus does not shake as it is positioned against the chuck. That is, the gauge of the apparatus is moved by a mechanism and not manually. Furthermore, the bottom surface of the apparatus that is placed on the bottom of the chamber has a high degree of planarity, which contributes to the precision of the apparatus. In addition, the operator can monitor the operation of the apparatus in real time using the display.

Accordingly, the present invention can be used to minimize processing errors otherwise caused by the misalignment of a chuck in semiconductor fabrication equipment, e.g., an ion implanter.

Although the present invention has been described above in connection with the preferred embodiments thereof, the present invention is not so limited. For instance, although the present invention has been mainly described for use in orienting a chuck of an ion implanter, the present invention can be used for providing a reference angle for other objects as well. Therefore, various changes to and other uses of the preferred embodiments are seen to be within the true spirit and scope of the invention as defined by the appended claims.

What is claimed is:

1. An apparatus for providing an object with a reference angle, comprising: a body, and a pin gauge disposed at an end of said body, said pin gauge comprising four projections which project in the direction of a Z axis away from an end surface of said body, two of said projections being located on an X axis and the other two projections being located on a Y axis, the X and Y axes extending orthogonal to one another and to the Z axis, and said projections being spaced from an origin where the X, Y and Z axes intersect.

2. An apparatus as claimed in claim 1, and further comprising a support that supports said body such that the body is slidable relative thereto, said support having a horizontal guide engaged with the body so as to guide said body horizontally in the direction of the Z axis relative to said support.

3. An apparatus as claimed in claim 2, wherein the bottom surface of said support is planar to within a tolerance of less than 1 µm.

4. An apparatus as claimed in claim 1, and further comprising a drive member integral with said body, said drive member including a fixed nut, and a horizontal drive screw threaded to the fixed nut and connected to said body, whereby rotation of said horizontal drive screw causes the screw and said body connected thereto to move horizontally.

5. An apparatus as claimed in claim 1, wherein said projections comprise proximity sensors operable to sense respective distances between ends of the projections and an object facing and spaced from the projections.

6. An apparatus as claimed in claim 5, and further comprising a display operatively connected to said pin gauge so as to display the distances measured by said proximity sensors.

7. An apparatus for providing an object with a reference angle, comprising:

a body;

a pin gauge disposed at an end of said body, said pin gauge comprising four projections which project in the direction of a Z axis away from an end surface of said body, two of said projections being located on an X axis and the other two projections being located on a Y axis, the X and Y axes extending orthogonal to one another and to the Z axis, and said projections being spaced from an origin where the X, Y and Z axes intersect;

a horizontal support supporting said body horizontally, said horizontal support having a horizontal guide that guides said body for movement in a horizontal direction parallel to said Z axis; and a vertical support supporting said body vertically, said vertical support having a vertical guide that guides said body for movement in a vertical direction parallel to said X axis.

8. An apparatus as claimed in claim 7, wherein said horizontal guide is in sliding engagement with said body, and said vertical guide is in sliding engagement with both said body and a vertical surface of said horizontal support.

9. An apparatus as claimed in claim 8, and further comprising:

a first drive member integral with said body, said first drive member including a fixed nut, and a horizontally extending drive screw threaded to the fixed nut and connected to said body, whereby rotation of said horizontally extending drive screw causes said body connected thereto to move horizontally along said horizontal guide, and a second drive member integral with said body, said second drive member including a second fixed nut, and a vertically extending drive screw threaded to the second fixed nut and connected to said body, whereby rotation of said vertically extending drive screw causes said body connected thereto to move vertically.

10. An apparatus as claimed in claim 7, and further comprising a base disposed on a bottom surface of said vertical support, said base having a bottom surface that is planar to within a tolerance of less than 1 $\mu$m.

11. An apparatus as claimed in claim 10, wherein said base is detachably mounted to said vertical support.

12. An apparatus as claimed in claim 7, wherein said projections comprise proximity sensors operable to sense respective distances between ends of the projections and an object facing and spaced from the projections.

13. An apparatus as claimed in claim 12, and further comprising a display operatively connected to said pin gauge so as to display the distances measured by said proximity sensors.

14. A method of aligning a chuck of semiconductor fabrication equipment, comprising:

placing a reference angle providing apparatus on the bottom surface of a process chamber in which the chuck is disposed, the reference angle providing apparatus having a body, and a pin gauge disposed at an end of said body, said pin gauge comprising a plurality of projections which project in the direction of a Z axis away from an end surface of said body;

moving the pin gauge mechanically towards the chuck, including in the direction of said Z axis, until the pin gauge contacts a surface of the chuck;

once any one of said plurality of projections of the pin gauge contacts the surface of the chuck, checking the state of point contact between the end of each of the projections of the pin gauge and the surface of said chuck; and subsequently pivoting the chuck to place the surface of the chuck in point contact with the ends of all of the projections of the pin gauge, whereupon the chuck is oriented at a reference angle.

15. A method as claimed in claim 14, wherein said moving of the pin gauge mechanically comprises mechanically moving the body horizontally in the direction of the Z axis.

16. A method as claimed in claim 14, wherein said moving of the pin gauge mechanically comprises first mechanically moving the body vertically until the pin gauge is disposed at the same level as the chuck in the process chamber, and then mechanically moving the pin gauge horizontally in the direction of the Z axis.

17. A method as claimed in claim 14, wherein said checking the state of point contact comprises determining the respective distances between the ends of each of the projections of the pin gauge, that are not in contact with the surface of said chuck, and the chuck.

18. A method as claimed in claim 14, and further comprising subsequently tilting the chuck a predetermined amount from said reference angle.

19. A method as claimed in claim 14, and further comprising checking the calibration of the reference angle providing apparatus by placing the apparatus in a reference angle calibration unit comprising a horizontal bottom surface, and a vertical reference surface normal to the horizontal surface, with the reference angle providing apparatus resting on the horizontal surface of the calibration unit, and subsequently moving the pin gauge into contact with the vertical reference surface of the calibration unit.

20. A method as claimed in claim 14, wherein the pin gauge comprises four projections which project in the direction of the Z axis, two of the projections being located on an X axis and the other two projections being located on a Y axis, the X and Y axes extending orthogonal to one another and to the Z axis, and the projections being spaced from an origin where the X, Y and Z axes intersect, and wherein said pivoting of the chuck comprises placing the surface of the chuck in point contact with the ends of all four of the projections of the pin gauge, whereupon the chuck is oriented at first and second reference angles relative to a plane containing the X and Y axes, the first reference angle being one subtended in a plane containing the X and Z axes, and the second reference angle being one subtended in a plane containing the Y and Z axes.

* * * * *